(12) United States Patent
Wright et al.

(10) Patent No.: US 6,261,936 B1
(45) Date of Patent: Jul. 17, 2001

(54) POLY GATE CD PASSIVATION FOR METROLOGY CONTROL

(75) Inventors: Marilyn I. Wright; Derick J. Wristers, both of Austin; Jon D. Cheek, Round Rock, all of TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/589,378

(22) Filed: Jun. 7, 2000

(51) Int. Cl.⁷ ............................................. H01L 21/4763
(52) U.S. Cl. ..................... 438/595; 438/230; 438/303; 438/586; 437/41; 437/57; 437/58; 437/200
(58) Field of Search ........................... 438/595, 303, 438/586, 230; 437/57, 58, 41, 200

(56) References Cited

U.S. PATENT DOCUMENTS

| | | | |
|---|---|---|---|
| 5,030,590 | 7/1991 | Amini et al. | 438/704 |
| 5,147,499 | 9/1992 | Szwejkowski et al. | 438/704 |
| 5,270,228 * | 12/1993 | Ishikawa | 437/39 |
| 5,296,093 | 3/1994 | Szwejkowski et al. | 216/13 |
| 5,431,770 | 7/1995 | Lee et al. | 438/704 |
| 5,550,427 * | 8/1996 | Hayashi | 313/355 |
| 5,567,642 * | 10/1996 | Kim et al. | 437/57 |
| 5,614,428 | 3/1997 | Kapoor | 438/592 |
| 5,661,052 * | 8/1997 | Inoue et al. | 438/303 |
| 5,851,890 * | 12/1998 | Tsai et al. | 438/303 |
| 5,976,767 | 11/1999 | Li | 438/753 |
| 5,976,769 | 11/1999 | Chapman | 438/734 |

OTHER PUBLICATIONS

Stanley Wolf and Richard N. Tauber; *Silicon Processing for the VLSI Era*, vol. 1 –Process Technology; pp. 516–517 and 529–530; 1986.

Stanley Wolf and Richard N. Tauber; *Silicon Processing for the VLSI Era*; vol. 3: The Submicron MOSFET; pp. 461–462; 1995.

* cited by examiner

Primary Examiner—Vu A. Le
Assistant Examiner—Pho Luu
(74) Attorney, Agent, or Firm—Timothy M. Honeycutt

(57) ABSTRACT

Various methods of fabricating gate structures, such as gates and gate stacks are provided. In one aspect, a method of fabricating a gate electrode on a substrate is provided that includes depositing a polycrystalline silicon film on the substrate and etching the polycrystalline film into a desired shape with a first sidewall and a second and opposite sidewall. A passivating oxide film is formed with a preselected thickness on the first and second sidewalls by oxidizing the silicon structure with a heated aqueous solution of ammonium hydroxide and hydrogen peroxide. Gate electrode formation with an oxide coating film of known thickness is provided. Linewidth metrology accuracy may be improved.

20 Claims, 3 Drawing Sheets

POLY GATE CD PASSIVATION FOR METROLOGY CONTROL

BACKGROUND OF THE INVENTION

1. Field of the Invention

This invention relates generally to semiconductor processing, and more particularly to methods of fabricating gate structures, such as gate electrodes.

2. Description of the Related Art

In a conventional process flow for forming a typical field effect transistor, a gate oxide layer is grown on a lightly doped silicon substrate and a layer of polysilicon is deposited on the gate oxide layer. The polysilicon is then anisotropically etched selectively to the gate oxide, leaving a polysilicon gate electrode stacked on top of the gate oxide layer. Following formation of the polysilicon gate electrode, a source and a drain are formed, usually by implanting a dopant species into the substrate. The gate electrode acts as a hard mask against the implant so that the source and drain are formed in the substrate self-aligned to the gate electrode. The substrate is then annealed to activate the dopant in the source and the drain. Salicidation steps frequently follow the formation of the source and drain.

The patterning of the polysilicon gate electrode entails masking the polysilicon layer with a resist and subsequently anisotropically etching the exposed portions of the polysilicon. The resist is patterned, that is, exposed and developed, into a shape that corresponds to the desired linewidth and floor plan of the polysilicon gate electrode defined by the anisotropic etch. Positive resists are frequently used, and may be of several different types, depending upon a number of parameters, such as the wavelength of illuminating radiation and the thickness of the polysilicon layer, to name a few. The poly gate mask is commonly patterned with a minimum lateral dimension or width corresponding to the minimum feature size or critical dimension ("CD") that may be patterned using the available microlithography technology.

With the resist in place, the polysilicon layer is anisotropically etched. The etch is usually carried out in a plasma ambient with ion bombardment. The etch consists of a main etch to remove the bulk of the exposed polysilicon and an overetch to catch any lingering polysilicon or etch by-products remaining. Endpoint detection for the main etch is frequently by emission spectroscopy, while the overetch is usually a timed process. A variety of etch chemistries are used to etch polysilicon. Most of these rely on fluorine-based molecules that, in conjunction with liberated resist particles, provide sidewall passivation during the etch.

The formation of a thin native oxide film on the exposed surfaces of the polysilicon gate electrode inevitably follows the gate etch process. The etch chamber will normally contain minute quantities of derelict oxygen, and may even contain large quantities where oxygen is used in the plasma ambient. The exposed silicon surfaces will readily react with oxygen present in the etch chamber. In many conventional processes, wafers are removed from vacuum following gate etch and stored for some period of time prior to additional processing. Native oxide will quickly grow on the exposed silicon surfaces after exposure to ambient air.

To ensure that the gate masking and etching processes produce a gate with a CD that falls within specifications, gate metrology measurements normally follow gate etch. The CD of the gate electrode determines, in large part, the electrical performance of the transistor. Accuracy in the linewidth measurement of gate CD's is therefore a vital aspect of reliably predicting the ultimate electrical behavior of the transistor. Unfortunately, native oxide film formation on the gate may lead to inaccurate determinations of gate CD. The problem stems from the fact that currently available metrology instruments will more often than not fail to discriminate oxide from polysilicon. As a result, the measured linewidth of the gate electrode will be greater than the actual linewidth of the gate electrode. The problem might be easily overcome if the thickness of the native oxide film were accurately known. In this circumstance, the true gate CD could be computed by subtracting twice the known thickness of the native oxide film. However, manufacturing experience has demonstrated that the formation of native oxide films on polysilicon gate electrodes exhibits a queue dependence that is difficult to predict. Thus, there is a high likelihood that a native oxide film will have grown to an unknown thickness at the time of linewidth measurement for the gate electrode.

The present invention is directed to overcoming or reducing the effects of one or more of the foregoing disadvantages.

SUMMARY OF THE INVENTION

In accordance with one aspect of the present invention, a method of fabricating a circuit device is provided that includes forming a silicon structure and forming a passivating oxide film with a preselected thickness on the silicon structure by oxidizing the silicon structure with a heated aqueous solution of ammonium hydroxide and hydrogen peroxide.

In accordance with another aspect of the present invention, a method of fabricating a gate electrode on a substrate is provided that includes depositing a polycrystalline silicon film on the substrate and etching the polycrystalline film into a desired shape with a first sidewall and a second and opposite sidewall. A passivating oxide film is formed with a preselected thickness on the first and second sidewalls by oxidizing the first and second sidewalks with a heated aqueous solution of ammonium hydroxide and hydrogen peroxide.

In accordance with another aspect of the present invention, a method of fabricating a gate electrode stack on a substrate is provided that includes forming a gate oxide layer on the substrate and depositing a polycrystalline silicon film on the gate oxide layer. The polycrystalline silicon film is etched into a desired shape with a first sidewall and a second and opposite sidewall. A passivating oxide film is formed with a preselected thickness on the first and second sidewalls by oxidizing the first and second sidewalks with a heated aqueous solution of ammonium hydroxide and hydrogen peroxide.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
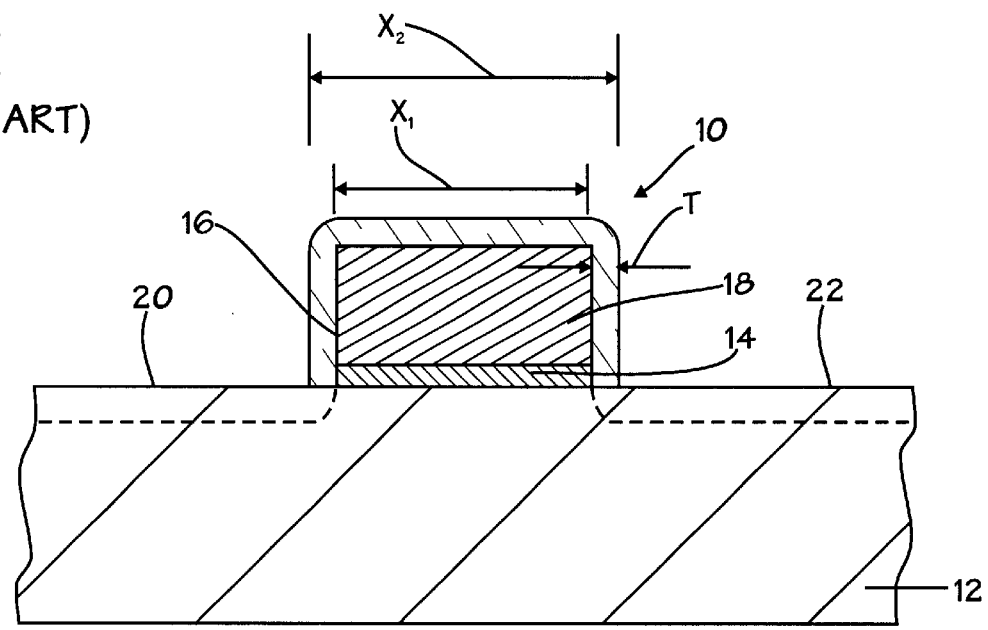
FIG. 1 is a cross-sectional view of a conventionally fabricated polysilicon gate electrode stack with a native oxide film grown thereon.

In the drawings described below, reference numerals are generally repeated where identical elements appear in more than one figure. FIG. 1 is a cross-sectional view of an exemplary conventional field effect transistor 10 fabricated on a semiconductor substrate 12. The transistor 10 includes a gate dielectric layer 14 fabricated on the substrate 12 and a polysilicon gate electrode 16 formed on the gate insulating layer 14. The gate electrode 16 is coated with a native oxide film 18 of unknown thickness T that forms when the gate electrode 16 is exposed to oxygen, even in minute quantities. Single graded source/drain regions 20 and 22 are provided in the substrate 12.

The gate electrode 16 has an actual lateral dimension $X_1$. However, the presence of the native oxide film 18 effectively obscures the true width $X_1$ of the gate electrode 16 during linewidth measurement. As noted above, the problem stems from the fact that currently available metrology instruments will more often than not fail to discriminate oxide from polysilicon. As a result, the measured lateral dimension of the gate electrode 16 will be the value $X_2$ which is larger than the true width $X_1$. If the thickness T of the film 18 were accurately known, the true gate width could be computed by subtracting twice the thickness T of the film 18. Unfortunately, the thickness T of the film 18 is unpredictable.

Figure 2:
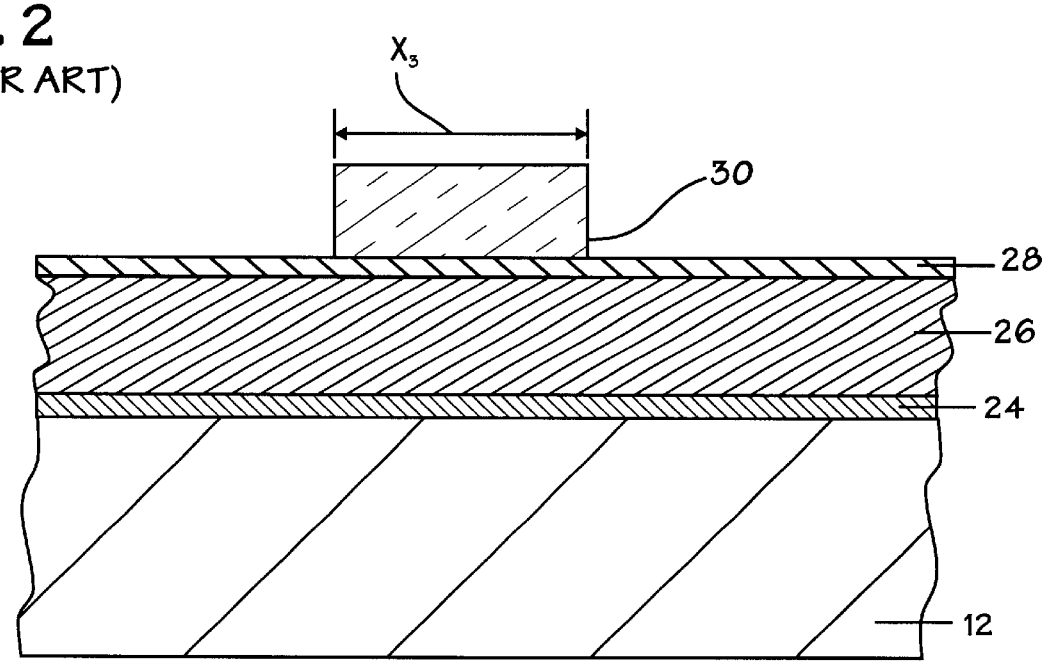
FIGS. 2 and 3 are cross-sectional views of the semiconductor substrate of FIG. 1 depicting the conventional formation of the gate electrode stack.
Figure 3:
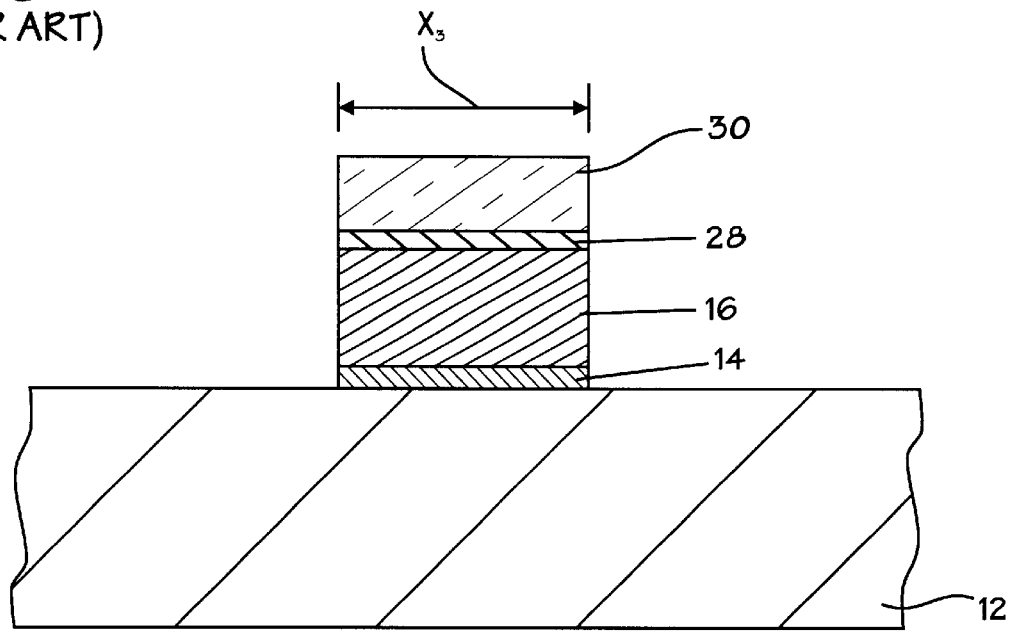

A conventional process for fabricating the gate electrode 16 may be understood by referring now to FIGS. 2 and 3. Initially, an oxide film 24 is blanket deposited or thermally grown on the substrate 12. A bulk polysilicon film 26 is thereafter blanket deposited on the oxide film 24 and capped with an anti-reflective coating 28 of silicon nitride. Through subsequent directional etching, the gate electrode 16 and the gate dielectric layer 14 will be defined from the bulk films 24 and 26. Following the deposition of the anti-reflective coating 28, a photomask 30 composed of resist is patterned on the anti-reflective coating 28. As is common in many conventional device fabrication processes, the photomask 30 is patterned with a lateral dimension $X_3$ that corresponds to the minimum CD for the applicable design rules.

Following definition of the photomask 30, a directional etch is performed to define the gate electrode 16 and the gate dielectric layer 14 as shown in the FIG. 3. If the etch process is completely anisotropic, the gate electrode 16 will be defined with an initial lateral dimension matched to the width $X_3$ of the overlying mask 30. The mask 30 and the anti-reflective coating 28 are thereafter removed in anticipation of source/drain formation and other steps.

After etch definition of the gate electrode 16, formation of the native oxide film 18 shown in FIG. 1 is inevitable, particularly where the substrate 12 is removed from vacuum. The oxidation reaction that produces the oxide film 18 is consumptive of silicon, and thus reduces the lateral dimension of the gate electrode 16 from $X_3$ to $X_1$. As noted above, the difficulty herein lies in the fact that the formation of the native oxide film 18 exhibits a queue dependence that has been difficult to predict. Thus, there is a high likelihood that the film 18 will have grown to an unknown thickness T at the time of linewidth measurement for the gate electrode 16. The fallout of this lack of predictability in the thickness of the film 18 is a linewidth measurement for the gate electrode 16 which yields a value $X_2$, a value that does not reveal the true lateral dimension $X_1$, of the gate electrode 16.

Figure 4:
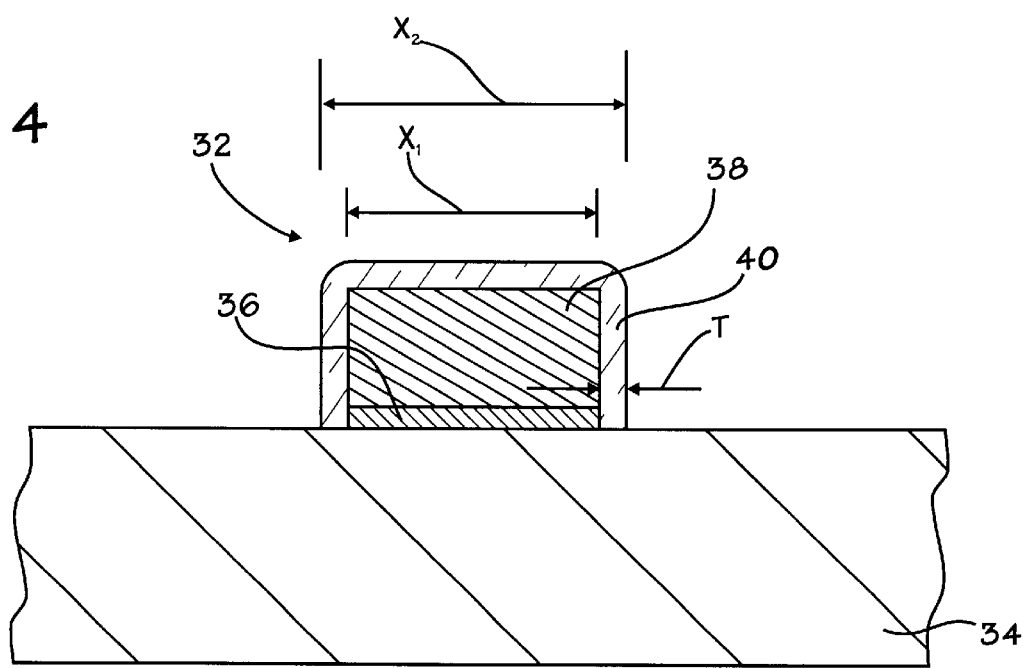
FIG. 4 is a cross-sectional view like FIG. 1, but depicts an exemplary gate electrode stack fabricated in accordance with the present invention.

FIG. 4 is a cross-sectional view of an exemplary embodiment of a circuit device 32 fabricated on a semiconductor substrate 34 in accordance with the present invention. The device 32 may be a gate electrode stack as shown, a conducting line or interconnect or other structure. Only a small portion of the substrate 34 is visible and the device 32 may be part of a much larger integrated circuit (not shown) implemented on the substrate 34. The device 32 includes a gate dielectric layer 36 positioned on the substrate 34 and a silicon structure or gate electrode 38 fabricated on the gate dielectric layer 36. Like the conventional gate electrode 16 described above, the gate electrode 38 is coated with an oxide film 40. However unlike the conventional fabrication process described above, the oxide film 40 is deliberately formed with known thickness T using a wet oxidation process in accordance with the present invention. In this way, the true width $X_1$, of the gate electrode 38 may be derived from metrology measurement of the combined width $X_2$ of the gate electrode 38 and the film 40. The known thickness T of the film 40 may be doubled and subtracted from the quantity $X_2$ to yield the true gate width $X_1$.

Figure 5:
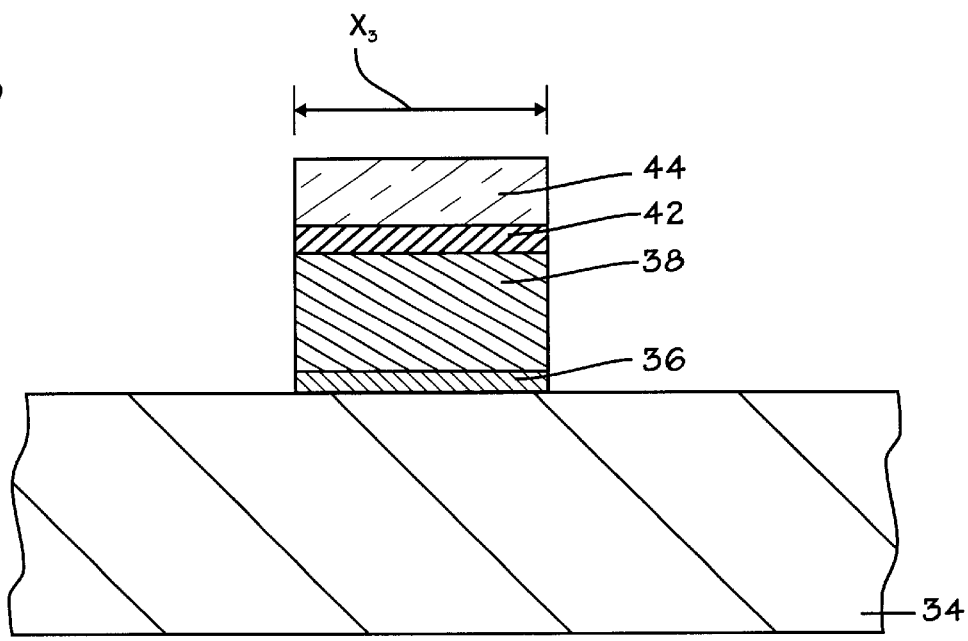
FIG. 5 is a cross-sectional view like FIG. 4 but depicts the initial etch definition of the gate electrode stack in accordance with the present invention.

An exemplary process flow for fabricating the circuit device 32 in accordance with the present invention may be understood by referring now to FIGS. 2 and 5. The fabrication process will be described in the context of a field effect transistor gate stack. However, the skilled artisan will appreciate that the techniques described herein may be applied to other circuit devices utilizing silicon-based structures. Initially, the substrate 34 is processed as generally described above in conjunction with FIG. 2 to yield the etched gate stack consisting of the gate dielectric layer 36, the gate electrode 38 and an anti-reflective coating 42. The substrate 34 itself, may be composed of n-doped silicon, p-doped silicon, silicon-on-insulator or other suitable substrate materials. Well known techniques may be used to apply the gate dielectric layer 36 and the gate electrode 38. For example, thermal oxidation or CVD may be used to establish the gate dielectric layer 36. Thereafter, amorphous or polycrystalline silicon may be deposited and etched to yield the gate electrode 38. The thicknesses of the gate dielectric layer 36 and the gate electrode 38 are largely matters of design discretion. The antireflective coating layer 42 is formed on the polysilicon gate electrode 38 to facilitate lithographic patterning and may be composed of silicon nitride, silicon oxynitride or other well known antireflective coating materials.

The anisotropic etch to define the gate electrode 38 may be by chemical plasma etching, reactive ion etching or like anisotropic etching techniques and may use a variety of etch chemistries suitable for anisotropic etching polysilicon selective to the underlying gate insulating layer 36. For example, a mixture of HBr, $Cl_2$ and He may be used to etch selectively to oxide. The anisotropic etch of the polysilicon 38 may consist of a main etch and overetch or trim if desired. End point detection for the main etch may be by emission spectroscopy and end point detection for an overetch, if performed, may be timed.

As with the conventional process described above, the gate electrode shape is provided by a patterned photomask 44 applied prior to etch. The mask 44 is patterned with a lateral dimension $X_3$, which advantageously corresponds to the critical dimension ("CD") for the patterning of the gate electrode 38. Following etch definition, the mask 44 and the anti-reflective coating 42 are stripped by ashing or solvent techniques.

Referring again to FIG. 4, the oxide film 40 is now purposely formed to a preselected thickness T by wet oxidation of the gate electrode 38. In this way, the guesswork associated with native oxide growth in conventional processing may be eliminated. The gate electrode 38 is exposed to an aqueous ammonium hydroxide and peroxide mixture ("APM") in a bath or via a spray. The temperature of the etch solution may be about 50 to 85° C. Elevated temperatures increase the etch rate for better throughput. Various oxidizing solutions are possible. Exemplary APM solutions include, for example, a one (1) part $NH_4OH$: one (1) part $H_2O_2$; and five (5) parts $H_2O$ (by volume), and a one (1) part $NH_4OH$: four (4) parts $H_2O_2$; and twenty (20) parts $H_2O$ (by volume). The 1:1:5 solution yields an oxide growth rate of about 4 Å/minute. Thus, the oxide film 40 may be grown with a thickness T of about 20 Å in about 5 minutes. The 1:4:20 solution provides an oxide growth rate of about 2 Å/minute. These two exemplary etch solutions provide an oxide growth that is slow enough to permit tight growth control without unduly sacrificing throughput.

Following oxidation, the oxidizing solution is rinsed away with deionized water. Optionally, the substrate 34 may be rinsed with isopropyl alcohol and allowed to dry or may be spin dried in heated nitrogen.

Unlike the conventionally produced native oxide film 18 described above, the oxide film 40 is formed with a known thickness T that is not thereafter queue dependent. The oxide film 40 acts as a diffusion barrier, preventing ambient oxygen diffusion which might otherwise produce a thickening of the film 40 and introduce a queue dependence. Thus, no appreciable additional oxidation of the gate 38 occurs after the wet oxidation step.

Following the wet oxidation process, linewidth metrology may be performed using commercially available techniques, such scanning electron microscopy. The width $X_2$ of the combined gate electrode 38 and the oxide film 40 may be measured. Thereafter, twice the known thickness T of the grown oxide film 40 may be subtracted from the measured width $X_2$ to yield the true CD of the gate 38.

Figure 6:
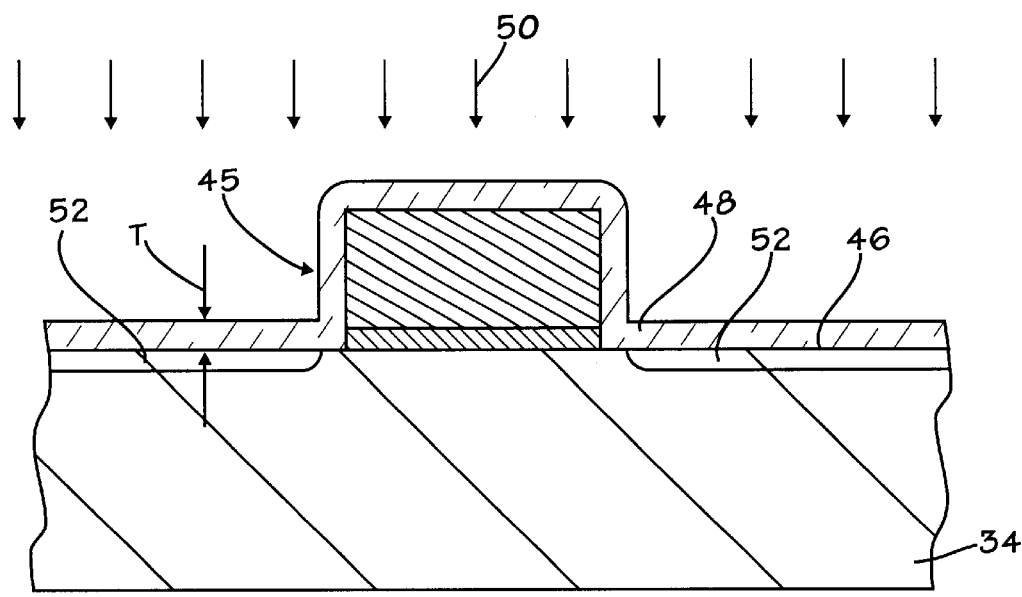
FIG. 6 is a cross-sectional view of a semiconductor substrate depicting formation of a screen oxide and ion implantation in accordance with the present invention.

If desired, the process of the present invention may be used to establish an oxide film on a silicon surface for the purpose of providing a screen oxide of known thickness. In this way, shallow junction implants may be performed with enhanced precision. The process is illustrated in FIG. 6, which is cross-sectional view like FIG. 4 and shows a gate electrode stack 45 formed on a silicon substrate 34. A silicon surface 46 of the substrate 34 may be oxidized using the aforementioned wet APM solution to establish a screen oxide 48 of known thickness T. Thereafter, one or more implants of impurity ions 50 may be performed through the oxide film 48 to establish one or more doped regions 52.

The skilled artisan will appreciate that the process of the present invention enables the patterning of silicon-based structures with a passivating oxide film of known thickness. Where the silicon structure is a gate electrode or other line, subsequent linewidth metrology may be performed with greater accuracy. The unpredictable queue dependence associated with natural native oxide growth is eliminated. Where the silicon structure is a screen oxide, junction positioning is enhanced since the thickness of the screen oxide may be carefully tailored to a known thickness.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a circuit device, comprising:
    forming a silicon structure; and
    forming a passivating oxide film with a preselected thickness on the silicon structure by oxidizing the silicon structure with a heated aqueous solution of ammonium hydroxide and hydrogen peroxide.

2. The method of claim 1, wherein the step of forming the silicon structure comprises depositing polycrystalline silicon on a substrate, etching the polysilicon to define a gate structure with a first sidewall and a second and opposite sidewall, the passivating oxide film being formed on the first and second sidewalls.

3. The method of claim 1, comprising measuring a lateral dimension of the silicon structure following the formation of the passivating oxide film.

4. The method of claim 1, wherein the aqueous solution comprises about one part ammonium hydroxide, about one part hydrogen peroxide and about five parts water.

5. The method of claim 1, wherein the aqueous solution is heated to about 50 to 85° C.

6. The method of claim 1, comprising forming an insulating film beneath the silicon structure.

7. The method of claim 1, wherein the oxidizing is performed in a bath.

8. The method of claim 1, comprising implanting impurity ions through the passivating film to establish a doped region.

9. A method of fabricating a gate electrode on a substrate, comprising:
    depositing a polycrystalline silicon film on the substrate;
    etching the polycrystalline film into a desired shape with a first sidewall aid a second and opposite sidewall; and
    forming a passivating oxide film with a preselected thickness on the first and second sidewalls by oxidizing the first and second sidewalls with a heated aqueous solution of ammonium hydroxide and hydrogen peroxide.

10. The method of claim 9, comprising measuring a lateral dimension of the gate electrode following the formation of the passivating oxide film.

11. The method of claim 9, wherein the aqueous solution comprises about one part ammonium hydroxide, about one part hydrogen peroxide and about five parts water.

12. The method of claim 9, wherein the aqueous solution is heated to about 50 to 85° C.

13. The method of claim 9, comprising forming a gate dielectric layer beneath the gate electrode.

14. The method of claim 9, wherein the oxidizing is performed in a bath.

15. A method of fabricating a gate electrode stack on a substrate, comprising:
    forming a gate oxide layer on the substrate;
    depositing a polycrystalline silicon film on the gate oxide layer;
    etching the polycrystalline silicon film into a desired shape with a first sidewall and a second and opposite sidewall; and
    forming a passivating oxide film with a preselected thickness on the first and second sidewalls by oxidizing the first and second sidewalls with a heated aqueous solution of ammonium hydroxide and hydrogen peroxide.

16. The method of claim 15, comprising measuring a lateral dimension of the gate electrode following the formation of the passivating oxide film.

17. The method of claim 15, wherein the aqueous solution comprises about one part ammonium hydroxide, about one part hydrogen peroxide and about five parts water.

18. The method of claim 15, wherein the aqueous solution is heated to about 50 to 85° C.

19. The method of claim 15, comprising forming a gate dielectric layer beneath the gate electrode.

20. The method of claim 15, wherein the oxidizing is performed in a bath.

* * * * *